(12) United States Patent
Sato et al.

(10) Patent No.: US 10,002,976 B2
(45) Date of Patent: Jun. 19, 2018

(54) SOLAR CELL

(71) Applicant: Panasonic Intellectual Property Management Co., Ltd., Osaka (JP)

(72) Inventors: Shoji Sato, Osaka (JP); Shigeharu Taira, Osaka (JP); Hirotada Inoue, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/052,865

(22) Filed: Feb. 24, 2016

(65) Prior Publication Data

US 2016/0172511 A1    Jun. 16, 2016

Related U.S. Application Data

(63) Continuation of application No. PCT/JP2014/069697, filed on Jul. 25, 2014.

(30) Foreign Application Priority Data

Aug. 29, 2013  (JP) ................................ 2013-177966

(51) Int. Cl.
*H01L 31/0224* (2006.01)
*H01L 31/02* (2006.01)

(52) U.S. Cl.
CPC .. *H01L 31/022433* (2013.01); *H01L 31/0201* (2013.01); *H01L 31/0224* (2013.01); *Y02E 10/50* (2013.01)

(58) Field of Classification Search
CPC .............................................. H01L 31/022433
See application file for complete search history.

(56) References Cited

U.S. PATENT DOCUMENTS 6,573,445 B1 *  6/2003  Burgers .......... H01L 31/022433
                                                      136/244
9,099,590 B2     8/2015  Taira et al.
(Continued)

FOREIGN PATENT DOCUMENTS

JP    2002-530894 A    9/2002
JP    2008-135655 A    6/2008
(Continued)

*Primary Examiner* — Magali P Slawski
(74) *Attorney, Agent, or Firm* — Metrolexis Law Group, PLLC

(57) ABSTRACT

A first finger electrode group including finger electrodes on the first principal surface. A second finger electrode group including finger electrodes on the second principal surface. The second finger electrode group is divided into divided electrode portions, the number of electrodes of the electrode portions decreasing as a distance from a central portion of the second finger electrode group increases towards outside, and a coupling portion is arranged between each adjacent ones of the divided electrode portions and electrically connects at least two of the finger electrodes of the divided electrode portion on inside with at least one of the finger electrodes of the divided electrode portion on outside. The number of finger electrodes of the divided electrode portion closest to the central portion of the second finger electrode group is larger than the number of finger electrodes of the first finger electrode group.

13 Claims, 8 Drawing Sheets

(56) References Cited

U.S. PATENT DOCUMENTS

| | | | |
|---|---|---|---|
| 2011/0048491 A1* | 3/2011 | Taira | H01L 31/022433 136/244 |
| 2011/0168255 A1* | 7/2011 | Wu | H01L 31/022425 136/256 |
| 2011/0247688 A1 | 10/2011 | Yoon et al. | |
| 2011/0277835 A1 | 11/2011 | Masson et al. | |
| 2012/0031457 A1 | 2/2012 | Taira et al. | |
| 2012/0125396 A1 | 5/2012 | Taira et al. | |

FOREIGN PATENT DOCUMENTS

| | | |
|---|---|---|
| JP | 2011-049525 A | 3/2011 |
| WO | 00-31803 A1 | 6/2010 |
| WO | 2010-095583 A1 | 8/2010 |

\* cited by examiner

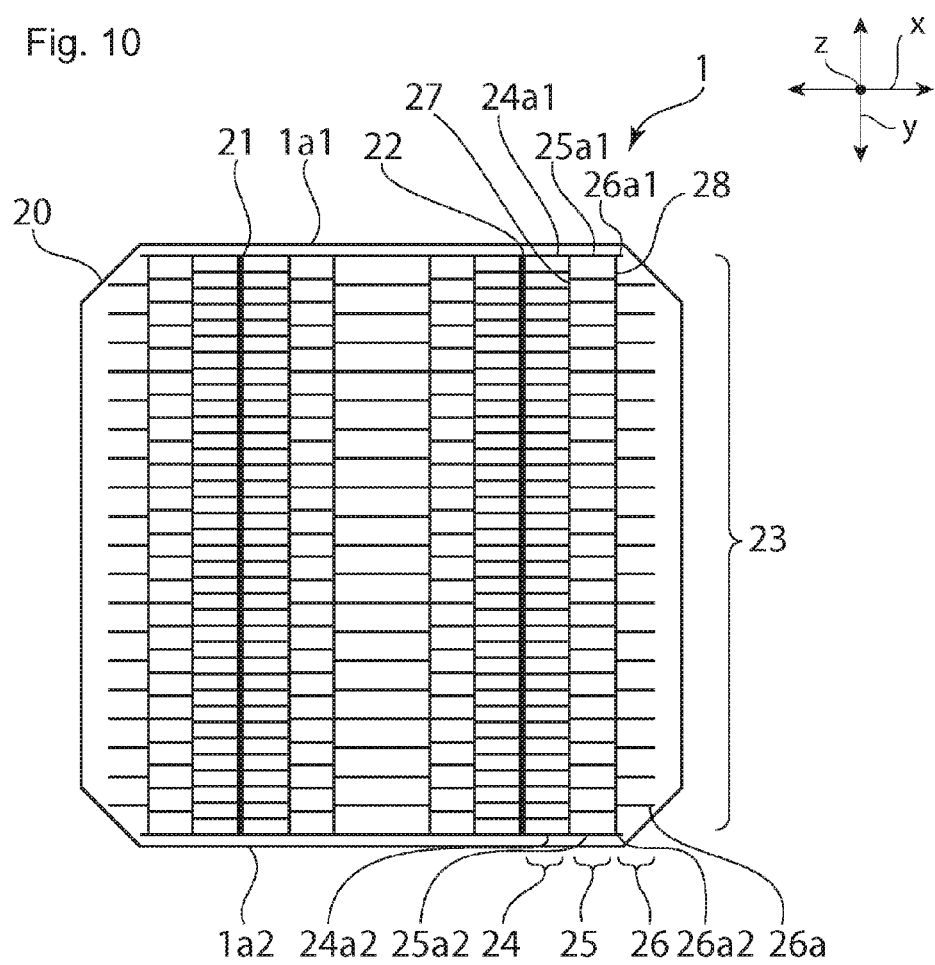

SOLAR CELL

CROSS REFERENCE TO RELATED APPLICATIONS

This application is a continuation application of International Application No. PCT/JP2014/069697, filed on Jul. 25, 2014, entitled "SOLAR CELL", which claims priority based on the Article 8 of Patent Cooperation Treaty from prior Japanese Patent Application No. 2013-177966, filed on Aug. 29, 2013, the entire contents of which are incorporated herein by reference.

BACKGROUND

The disclosure relates to a solar cell and a solar cell module.

A solar cell module has a structure in which solar cells are connected in series or in parallel by wiring electrically connected to electrodes on surfaces of the solar cell. As a solar cell electrode electrically connected to wiring, a finger electrode is commonly formed. A finger electrode is formed on a light-receiving surface side of a solar cell, and may also be formed on a back surface side, which is opposite to the light-receiving surface (See Japanese Patent Application Publication No. 2011-49525 (Patent Document 1), for example).

SUMMARY

A solar cell according to an embodiment includes: a first principal surface, and a second principal surface positioned on a side opposite to the first principal surface; a first finger electrode group including finger electrodes provided on the first principal surface; and a second finger electrode group including finger electrodes provided on the second principal surface. The second finger electrode group is divided into divided electrode portions, the number of electrodes of the electrode portions decreasing as a distance from a central portion of the second finger electrode group increases toward outside, and a coupling portion is provided between each adjacent ones of the divided electrode portions and electrically connects at least two of the finger electrodes of the divided electrode portion on inside with at least one of the finger electrodes of the divided electrode portion on outside, and the number of finger electrodes of the divided electrode portion closest to the central portion of the second finger electrode group is larger than the number of finger electrodes of the first finger electrode group.

A solar cell of another embodiment comprises a first principal surface, and a second principal surface positioned on a side opposite to the first principal surface, a first finger electrode group including finger electrodes on the first principal surface, a second finger electrode group including finger electrodes on the second principal surface, a first bus bar electrode on the first principal surface and extending in a direction crossing the finger electrodes of the first finger electrode group; and a second bus bar electrode on the second principal surface, extending in a direction crossing the finger electrodes of the second finger electrode group, wherein the second finger electrode group is divided into divided electrode portions, the number of electrodes of the electrode portions increasing towards the second bus bar electrode, and a coupling portion is arranged between each adjacent ones of the divided electrode portions and electrically connects at least two of the finger electrodes of the divided electrode portion on inside with at least one of the finger electrodes of the divided electrode portion on outside, and the number of finger electrodes of the divided electrode portion closest to the second bus bar electrode is larger than the number of finger electrodes of the first finger electrode group.

A solar cell module of an embodiment comprises solar cells, and a wiring that electrically connects a first solar cell and a second solar cell of the solar cells, wherein the first solar cell comprises a first finger electrode group including finger electrodes on a first principal surface; and a second finger electrode group including finger electrodes on the second principal surface positioned on a side opposite to the first principal surface, wherein the second finger electrode group is divided into divided electrode portions, the number of electrodes of the electrode portions decreasing as a distance from the wiring, and a coupling portion is arranged between each adjacent ones of the divided electrode portions and electrically connects at least two of the finger electrodes adjacent to the wiring with at least one of the finger electrodes farther than the at least two of the electrode from the wiring, and the number of finger electrodes of the divided electrode portion closest to the wiring of the first finger electrode group is larger than the number of finger electrodes of the second finger electrode group.

BRIEF DESCRIPTION OF THE DRAWINGS

FIG. 10 is a schematic enlarged top view illustrating a bus bar electrode and a finger electrode group on a second principal surface of a solar cell of a sixth embodiment.

DETAILED DESCRIPTION

Embodiments are described hereinafter. However, embodiments described below are only illustrative, and the invention is not limited to the embodiments below. In addition, in each drawing, a member having an substantially same function may be referred to with the same numeral.

[First Embodiment]

Figure 1A:
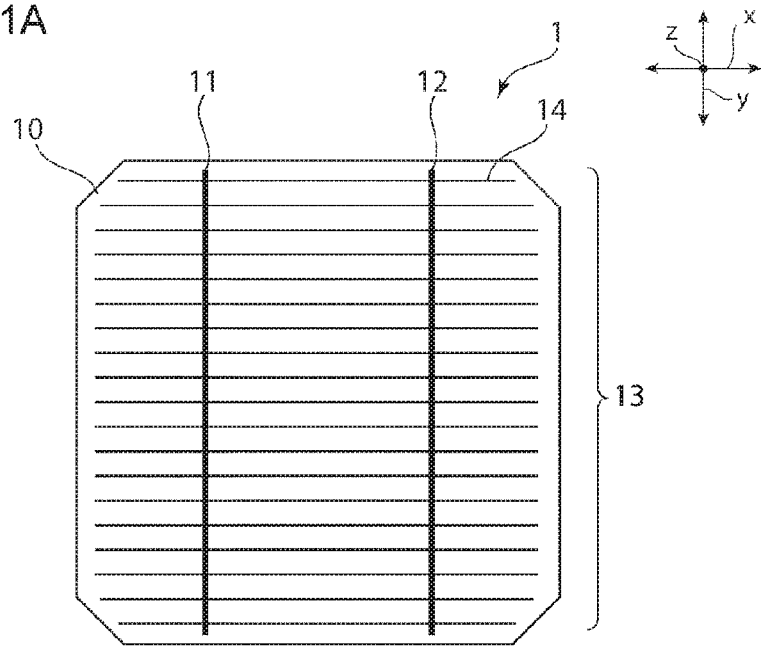
FIGS. 1A and 1B are a schematic top view illustrating a bus bar electrode and a finger electrode group on a first principal surface (FIG. 1A) and a second principal surface (FIG. 1B) of a solar cell of a first embodiment.
Figure 1B:
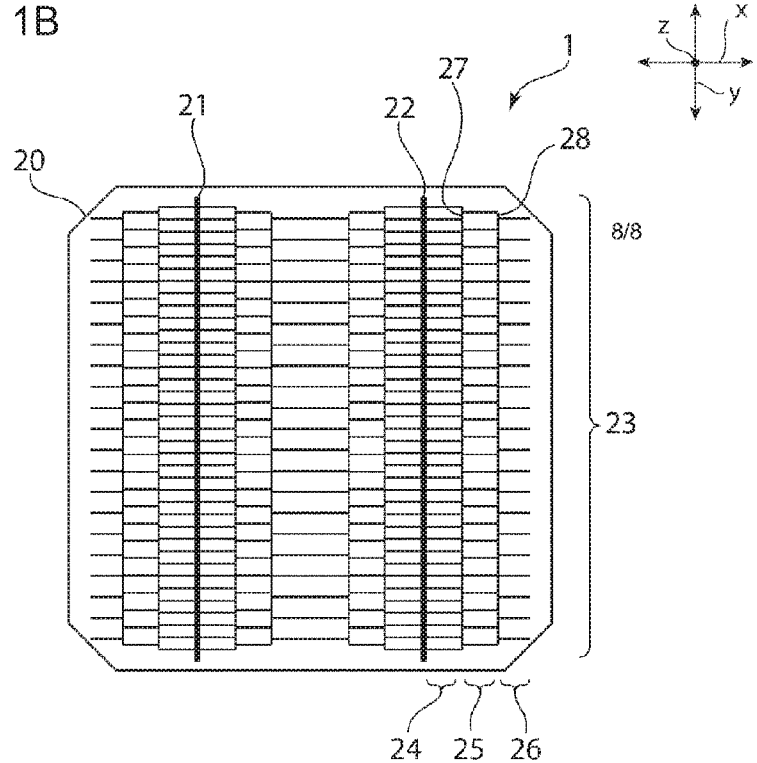

FIG. 1A is a schematic top view illustrating a bus bar electrode and a finger electrode group on a first principal surface of a solar cell of a first embodiment. FIG. 1B is a schematic top view illustrating a bus bar electrode and a finger electrode group on a second principal surface of the solar cell of the first embodiment.

As illustrated in FIG. 1A, two first bus bar electrodes 11 and 12 are provided on first principal surface 10 of solar cell 1. First bus bar electrodes 11 and 12 are formed to extend in a y direction. Finger electrodes 14 are provided to extend in a direction (x direction) substantially perpendicular to the direction (y direction) in which first bus bar electrodes 11 and 12 extend. First finger electrode group 13 is constituted of these finger electrodes 14.

As illustrated in FIG. 1B, two second bus bar electrodes 21 and 22 are provided on second principal surface 20 of solar cell 1. Second bus bar electrodes 21 and 22 are formed to extend in the y direction. Second finger electrode group 23 is provided to extend in the direction (x direction) substantially perpendicular to the direction (y direction) in which second bus bar electrodes 21 and 22 extend. Second finger electrode group 23 is divided into divided electrode portions 24, 25, and 26. As illustrated in FIG. 1B, second finger electrode group 23 including divided electrode portions 24, 25, and 26 is provided such that they are symmetrical on both sides of second bus bar electrodes 21 and 22.

Figure 2:
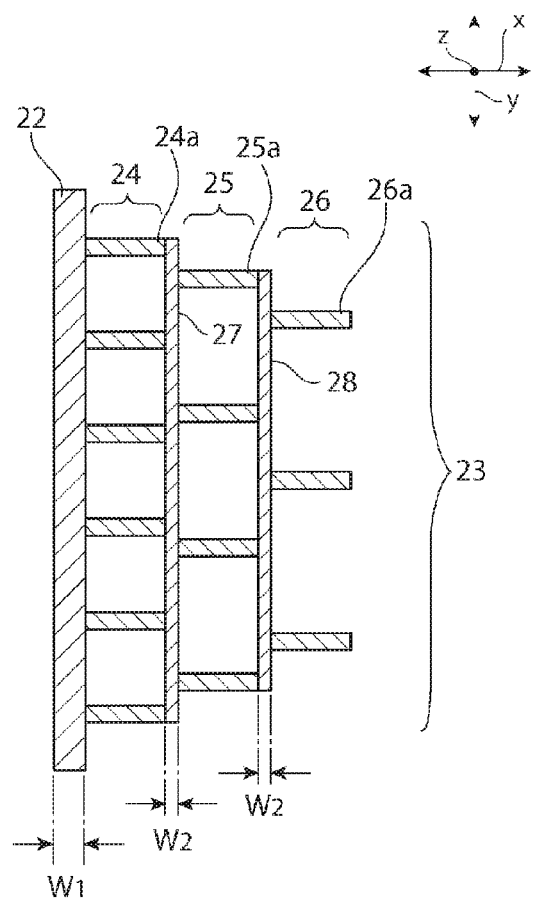
FIG. 2 is a schematic enlarged top view illustrating a second finger electrode group on the second principal surface of the solar cell of the first embodiment.

FIG. 2 is a schematic enlarged top view illustrating second finger electrode group 23 on second principal surface 20 of solar cell 1 of the first embodiment. As illustrated in FIG. 2, divided electrodes 24, 25, and 26 are formed such that the number of electrodes decreases as they are away from second bus bar electrode 22 toward the outside. Coupling portion 27 is provided between adjacent divided electrode portions 24 and 25. Coupling portion 28 is provided between adjacent divided electrode portions 25 and 26. Coupling portion 27 electrically connects at least two finger electrodes 24a of divided electrode portion 24 on the inside with at least one finger electrode 25a of divided electrode portion 25 on the outside. Similarly, coupling portion 28 electrically connects at least two finger electrodes 25a of divided electrode portion 25 on the inside with at least one finger electrode 26a of divided electrode portion 26 on the outside.

Finger electrodes 24a constituting divided electrode portion 24, finger electrodes 25a constituting divided electrode portion 25, and finger electrodes 26a constituting divided electrode portion 26 are each formed to extend in the direction (x direction) substantially perpendicular to the direction (y direction) in which second bus bar electrode 22 extends. In addition, coupling portions 27 and 28 are formed to extend in the direction (y direction) substantially parallel to the direction in which second bus bar electrode 22 extends.

In this embodiment, second finger electrode group 23 is divided into divided electrode portions 24, 25, and 26 in which the number of electrodes decreases as they are away from second bus bar electrode 22 toward the outside. Thus, compared with a conventional case in which finger electrode 24a of divided electrode portion 24 is directly extended to form a finger electrode, area of the entire finger electrode can be made smaller. Therefore, the amount of a conductive material used for formation of a finger electrode can be reduced. In addition, the amount of electric current generated by solar cell 1 increases towards second bus bar electrode 22. However, in this embodiment, divided electrode portions 24, 25, and 26 are formed such that the number of electrodes increases as they approach second bus bar electrode 22. Thus, the amount of a conductive material used for formation of a finger electrode can be reduced while suppressing reduction of output characteristics.

As illustrated in FIG. 2, in this embodiment, width W2 of coupling portions 27 and 28 is narrower than width W1 of second bus bar electrode 22. This also allows further reduction of the amount of the conductive material used for formation of the finger electrode.

In this embodiment, bus bar electrodes and the finger electrodes can be integrally formed through printing of paste containing particles of a conductive material such as silver and binder resin with the screen printing method or the like.

Figure 3:
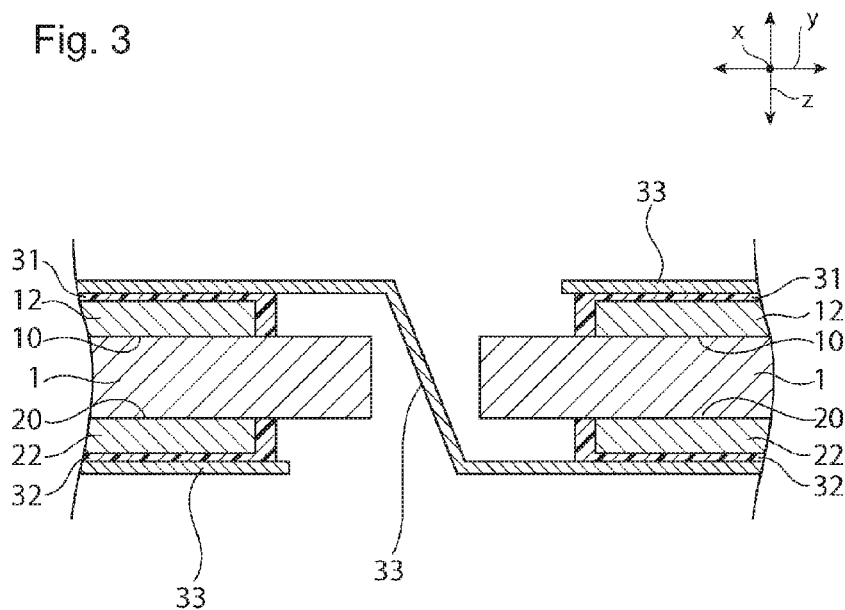
FIG. 3 is a schematic cross sectional view illustrating connection of wiring between adjacent solar cells.

FIG. 3 is a schematic sectional view illustrating connection of wiring between adjacent solar cells. As illustrated in FIG. 3, between adjacent solar cells 1, first bus bar electrode 12 provided on first principal surface 10 of one solar cell 1 is electrically connected with second bus bar electrode 22 provided on second principal surface 20 of other solar cell 1. First bus bar electrode 12 is bonded with wiring 33 by first resin adhesive layer 31. Second bus bar electrode 22 is bonded with wiring 33 by second resin adhesive layer 32.

As wiring, a material having a low-resistance member such as copper, silver, and aluminum, as a core material, a surface of which is silver plated or solder plated or the like, can be used.

In this embodiment, first resin adhesive layer 31 and second resin adhesive layer 32 are a resin adhesive layer including a conductive material. However, a resin adhesive layer which does not include a conductive material may be used to electrically connect first bus bar electrode 12 or second bus bar electrode 22 with wiring 33. In this case, first resin adhesive layer 31 and second resin adhesive layer 32 are respectively formed to cover the side surface of first bus bar electrode 12 and wiring 33 and the side surface of second bus bar electrode 22 and wiring 33. In this case, by coming into direct contact with each other, first bus bar electrode 12 and wiring 33, and second bus bar electrode 22 and wiring 33 are electrically connected. First resin adhesive layer 31 and second resin adhesive layer 32 can be formed of, for example, epoxy resin, acrylic resin, urethane resin, phenol resin, silicone resin, and a mixture thereof, or the like.

In this embodiment, first principal surface 10 corresponds to a light-receiving surface, and second principal surface 20 corresponds to a back surface. Therefore, a first principal surface 10 side is the light receiving side, and a second principal surface 20 side is the back surface side. When a solar cell module is fabricated, a first protective member made of glass or the like is provided on the first principal surface 10 side, and a second protective member made of a resin sheet or the like is provided on the second principal surface 20 side. A bonding layer made of resin or the like is provided between the first protective member and the second protective member. A solar cell string including solar cells 1 connected by wiring 33 is sealed in this bonding layer.

Figure 4:
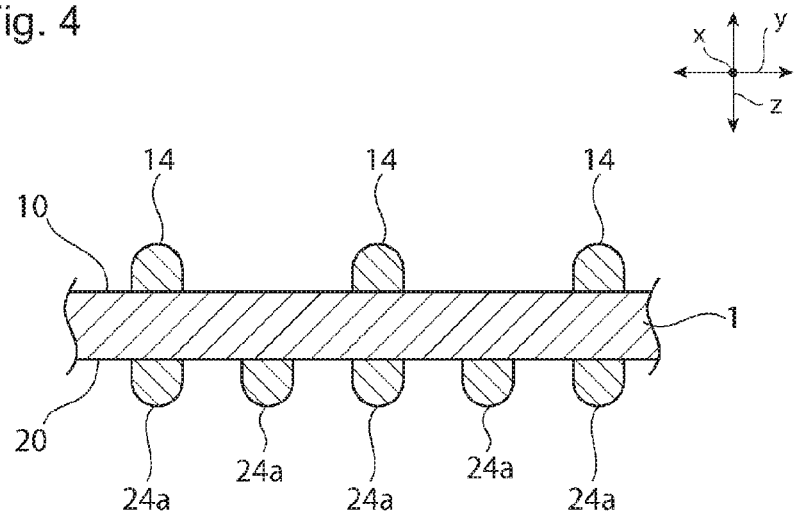
FIG. 4 is a schematic cross sectional view illustrating a relation between a position of a finger electrode on the first principal surface of the solar cell of the first embodiment and a position of a finger electrode in a divided electrode portion closest to a bus bar electrode on the second principal surface.

FIG. 4 is a schematic cross sectional view illustrating a relation between a position of finger electrode 14 on first principal surface 10 of solar cell 1 of the first embodiment and a position of finger electrode 24a in divided electrode portion 24 on second principal surface 20. As illustrated in FIG. 4, in divided electrode portion 24 which is closest to second bus bar electrode 22, finger electrodes 24a are each provided in an area overlapping finger electrodes 14 on first principal surface 10 and in an area not overlapping, when viewed in a direction (z direction) substantially perpendicular to first principal surface 10.

As described with reference to FIG. 3, wiring 33 is pressure-bonded to and electrically connected with first bus bar electrode 12 or second bus bar electrode 22. Since pressure in the pressure-bonding applies in the z direction, the pressure in the pressure-bonding can be distributed by arranging finger electrodes 14 on first principal surface 10 and finger electrodes 24a on second principal surface 20 such that they overlap when viewed in the z direction. More specifically, when the position of finger electrode 14 on first principal surface 10 and the position of finger electrode 24a on second principal surface 20 are misaligned when viewed in the z direction, shear force may be applied to solar cell 1, thus causing a crack or the like in solar cell 1. Arrangement of finger electrodes 14 and finger electrodes 24a such that they overlap when viewed in the z direction, as in this embodiment, can suppress generation of such shear force and suppress occurrence of a crack or the like in solar cell 1.

Pressure in the pressure-bonding of wiring 33 is mainly applied to vicinity of second bus bar electrode 22. Therefore, provision of the finger electrode such that the finger electrode overlaps the position of finger electrode 14 on first principal surface 10 may be acceptable if it is at least in first divided electrode portion 24 closest to second bus bar electrode 22. Therefore, in divided electrode portions 25 and 26 other than first divided electrode portion 24 which is closest to second bus bar electrode 22, it is not necessary that finger electrodes 25a and 26a are provided in the area overlapping finger electrodes 14, and finger electrodes 25a and 26a may be provided in the area not overlapping finger electrodes 14.

The number of finger electrodes 24a of first divided electrode portion 24 on second principal surface 20, which is the back surface, is set to be larger than the number of finger electrodes 14 on first principal surface 10, which is the light-receiving surface. In this case, as illustrated in FIG. 4, finger electrodes 24a are provided not only in the area overlapping finger electrodes 14 but also in the area not overlapping finger electrodes 14. In the embodiment illustrated in FIG. 4, one finger electrode 24a is provided on second principal surface 20, which is located at the midpoint between finger electrodes 14. If it is desired to further increase the number of finger electrodes 24a, two or more finger electrodes 24a can be provided on second principal surface 20 which is located in the area between finger electrodes 14.

[Second Embodiment]

Figure 5:
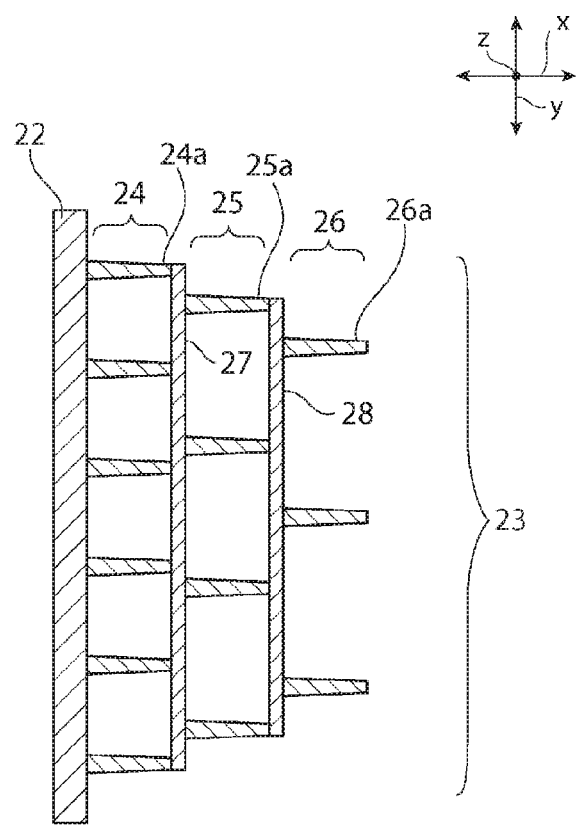
FIG. 5 is a schematic enlarged top view illustrating a second finger electrode group on a second principal surface of a solar cell of a second embodiment.

FIG. 5 is a schematic enlarged top view illustrating second finger electrode group 23 on second principal surface 20 of solar cell 1 of a second embodiment. This embodiment is the same as the first embodiment, except that second finger electrode group 23 is one illustrated in FIG. 5.

In this embodiment, finger electrodes 24a of first divided electrode portion 24 are formed into a tapered shape whose width widens as they approach second bus bar electrode 22. Similarly, finger electrodes 25a of second divided electrode portion 25 and finger electrodes 26a of third divided electrode 26 are also formed into a tapered shape whose width widens as they approach second bus bar electrode 22. Electric currents running through finger electrodes 24a, 25a, and 26a increase as they approach second bus bar electrode 22. Thus, resistance loss can be reduced by forming these electrodes into a tapered shape.

[Third Embodiment]

Figure 6:
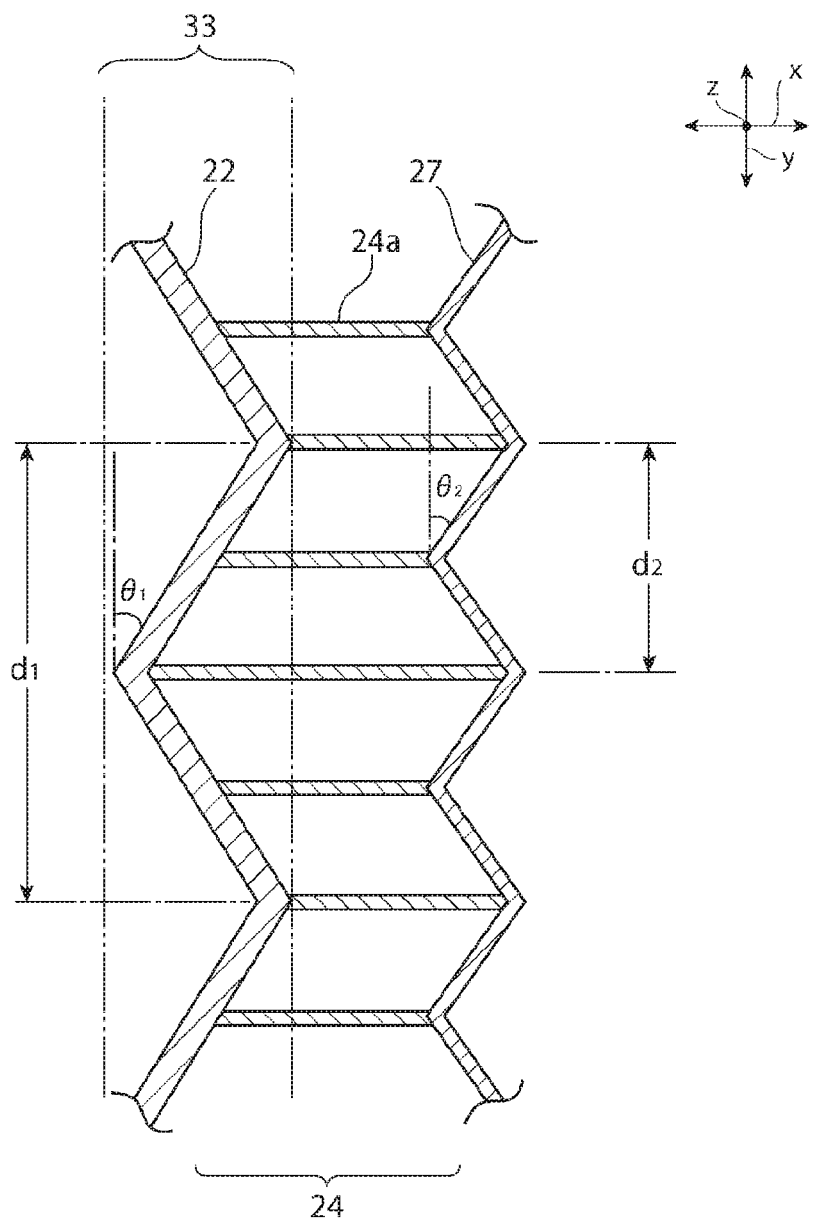
FIG. 6 is a schematic enlarged top view illustrating a second bus bar electrode and a second finger electrode group on a second principal surface of a solar cell of a third embodiment.

FIG. 6 is a schematic enlarged top view illustrating second bus bar electrode 22 and first divided electrode portion 24 of the second finger electrode group on second principal surface 20 of solar cell 1 of a third embodiment.

In this embodiment, second bus bar electrode 22 is formed like a zigzag to extend in the y direction. Coupling portion 27 is similarly formed like a zigzag to extend in the y direction. When second bus bar electrodes 21 and 22 and second finger electrode group 23, as illustrated in FIG. 1B, are integrally formed by printing them with a method such as the screen printing, they are typically formed by moving a squeegee in the x direction. This is to suppress insufficient printing in formation of a finger electrode by moving a squeegee in a direction in which the finger electrode extends, because width of the finger electrode is generally narrower than that of a bus bar electrode. Consequently, if an attempt is made to form bus bar electrode 22 and coupling portion 27 such that they extend linearly in the y direction, insufficient printing or the like may occur in formation of bus bar electrode 22 and coupling portion 27.

In this embodiment, second bus bar electrode 22 and coupling portion 27 are formed like a zigzag. Second bus bar electrode 22 is formed to incline by angle $\theta_1$ to a normal (y direction) in a direction (x direction) in which finger electrode 24a extends. In addition, coupling portion 27 is formed to incline by angle $\theta_2$ to the normal in the direction in which finger electrode 24a extends.

Thus, insufficient printing or the like can be suppressed from occurring in formation of second bus bar electrode 22 and coupling portion 27 even if they are printed by moving a squeegee in the x direction. While coupling portion 28 is not illustrated in FIG. 6, similarly to coupling portion 27, coupling portion 28 can also be formed like a zigzag to extend in the y direction. This can also suppress occurrence of insufficient printing or the like in formation of coupling 28.

As illustrated in FIG. 6, when both second bus bar electrode 22 and coupling portion 27 are formed like a zigzag, generally, coupling portion 27 is formed to be thinner than second bus bar electrode 22. Thus, it is preferable that spacing $d_2$ in the zigzag of coupling portion 27 is shorter than spacing $d_1$ in the zigzag of second bus bar electrode 22. This is also the same in the case in which coupling portion 28 is formed like a zigzag.

In this embodiment, although both second bus bar electrode 22 and coupling portion 27 are formed like a zigzag, only one of second bus bar electrode 22 and coupling portion 27 may be formed like a zigzag.

As illustrated in FIG. 6, it is preferable that second bus bar electrode 22 is formed like a zigzag in an area, illustrated by an imaginary line, where wiring 33 is pressure-bonded. This allows second bus bar electrode 22 and wiring 33 to be electrically connected in good conditions.

[Fourth Embodiment]

Figure 7:
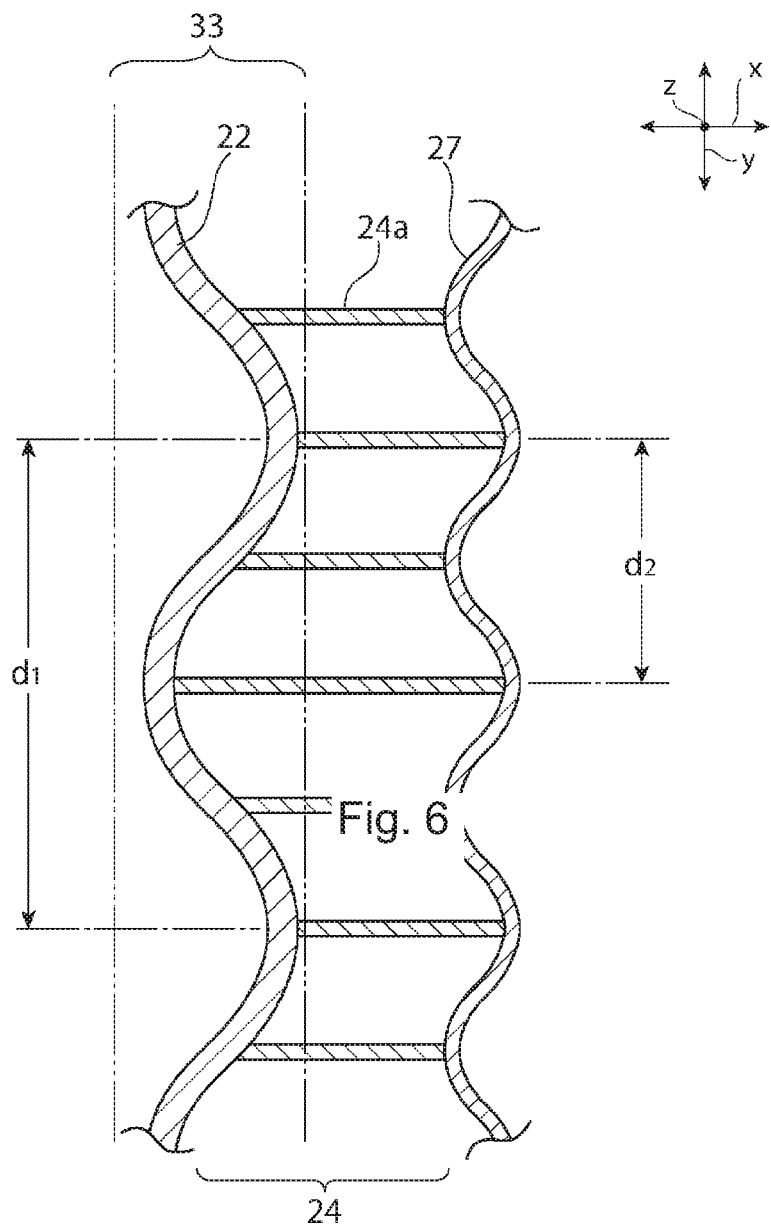
FIG. 7 is a schematic enlarged top view illustrating a second bus bar electrode and a second finger electrode group on a second principal surface of a solar cell of a fourth embodiment.

FIG. 7 is a schematic enlarged top view illustrating second bus bar electrode 22 and first divided electrode portion 24 of the second finger electrode group on second principal surface 20 of solar cell 1 of a fourth embodiment.

In this embodiment, second bus bar electrode 22 is formed like a wavy line to extend in the y direction. Coupling portion 27 is similarly formed like a wavy line to extend in the y direction. In this embodiment, since second bus bar electrode 22 and coupling portion 27 are formed like a wavy line, occurrence of insufficient printing or the like can be suppressed in formation of second bus bar electrode 22 and coupling portion 27, even if printing is performed by moving a squeegee in the x direction. Although coupling portion 28 is not illustrated in FIG. 7, similarly to coupling portion 27, coupling portion 28 can also be formed like a wavy line to extend in the y direction. This can also suppress occurrence of insufficient printing or the like in formation of coupling portion 28.

As illustrated in FIG. 7, if both second bus bar electrode 22 and coupling portion 27 are formed like a wavy line, generally, coupling portion 27 is formed to be thinner than second bus bar electrode 22. Thus, it is preferable that spacing $d_2$ of the wavy line of coupling portion 27 is shorter than spacing $d_1$ of the wavy line of second bus bar electrode 22. This is also the same in the case in which coupling portion 28 is formed like a wavy line.

In this embodiment, although both second bus bar electrode 22 and coupling portion 27 are formed like a wavy line, only one of second bus bar electrode 22 and coupling portion 27 may be formed like a wavy line. In this case, the other may be formed like a zigzag, as illustrated in FIG. 6.

As illustrated in FIG. 7, it is preferable that second bus bar electrode 22 is formed like a wavy line in an area, illustrated by an imaginary line, where wiring 33 is pressure-bonded. This allows second bus bar electrode 22 and wiring 33 to be electrically connected in good conditions.

[Fifth Embodiment]

Figure 8:
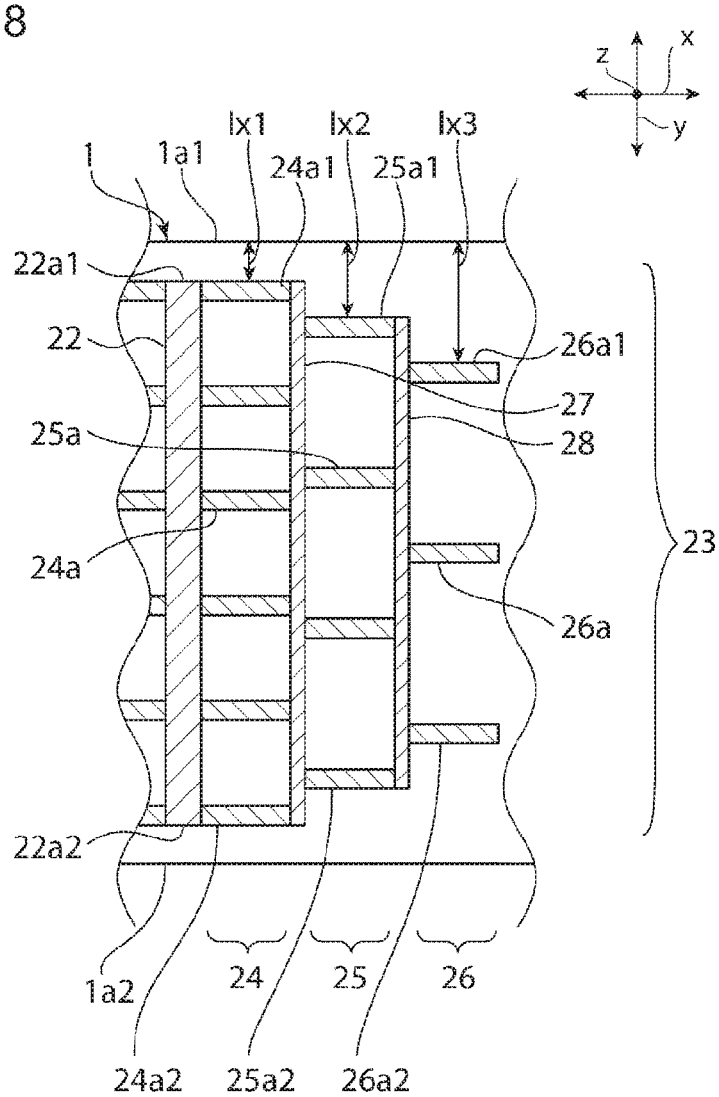
FIG. 8 is a schematic enlarged top view illustrating a second bus bar electrode and a second finger electrode group on a second principal surface of a solar cell of a fifth embodiment.

FIG. 8 is a schematic enlarged top view illustrating second bus bar electrode 22 and second finger electrode group 23 on a second principal surface of a solar cell of a fifth embodiment.

As illustrated in FIG. 8, in this embodiment, finger electrode 24a1 positioned at one end of first divided electrode portion 24 in the y direction is provided at a position of one end portion 22a1 of second bus bar electrode 22 in the direction (y direction) in which second bus bar electrode 22 extends. Similarly, finger electrode 24a2 positioned at the other end of first divided electrode 24 in the y direction is provided at other end position 22a2 of second bus bar electrode 22 in the y direction.

The configuration as described above allows finger electrode 24a1 positioned at the one end in the y direction to be brought close to one end portion 1a1 of solar cell 1. Therefore, distance 1x1 between one end portion 1a1 of solar cell 1 and finger electrode 24a1 can be made smaller and a carrier generated in vicinity of one end portion 1a1 of solar cell 1 can be efficiently collected. Similarly, finger electrode 24a2 positioned at the other end in the y direction can be brought close to other end portion 1a2 of solar cell 1 and a carrier generated in vicinity of other portion end 1a2 of solar cell 1 can be efficiently collected.

In addition, finger electrode 25a1 positioned at one end of second divided electrode portion 25 in the y direction can also be brought close to one end portion 1a1 of solar cell 1, and finger electrode 26a1 positioned at one end of third divided electrode portion 26 in the y direction can also be brought close to one end portion 1a1 of solar cell 1. Thus, distance 1x2 between one end portion 1a1 of solar cell 1 and finger electrode 25a1 and distance 1x3 between one end portion 1a1 of solar cell 1 and finger electrode 26a1 can be made smaller than in the case of the first embodiment illustrated in FIG. 2.

Therefore, a carrier generated in vicinity of one end portion 1a1 of solar cell 1 can be collected even more efficiently.

Similarly, since finger electrodes 25a2 and 26a2 positioned at the other end in the y direction can also be brought close to other end portion 1a2 of solar cell 1, a carrier generated in vicinity of other end portion 1a2 of solar cell 1 can be collected even more efficiently.

[Sixth Embodiment]

Figure 9:
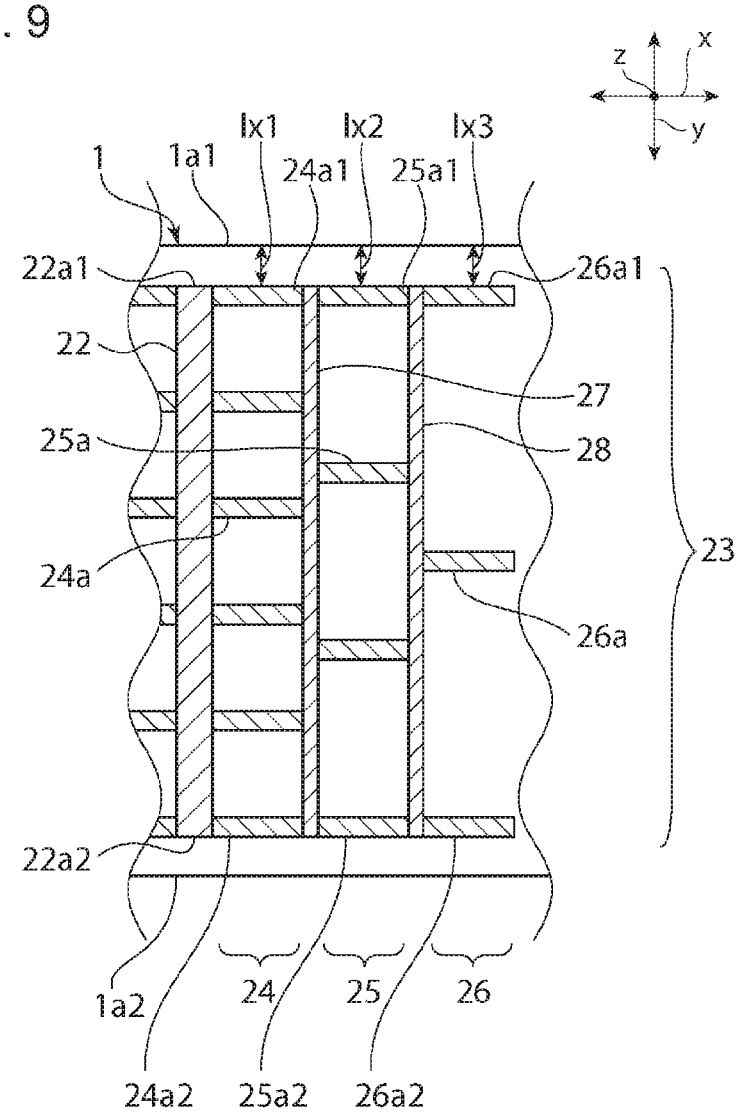
FIG. 9 is a schematic enlarged top view illustrating a second bus bar electrode and a second finger electrode group on a second principal surface of a solar cell of a sixth embodiment.

FIG. 9 is a schematic enlarged top view illustrating second bus bar electrode 22 and second finger electrode group 23 on a second principal surface of a solar cell of a sixth embodiment. FIG. 10 is a schematic top view illustrating the entirety of the bus bar electrode and the finger electrode group on the second principal surface of the solar cell of the sixth embodiment.

As illustrated in FIG. 9, also in this embodiment, similarly to the fifth embodiment, finger electrode 24a1 is provided at the position of one end portion 22a1 of second bus bar electrode 22 in the y direction, and finger electrode 24a2 is provided at the position of other end portion 22a2 of second bus bar electrode 22 in the y direction.

In this embodiment, finger electrode 25a1 positioned at one end of second divided electrode portion 25 in the y direction and finger electrode 26a1 positioned at one end of third divided electrode portion 26 in the y direction are also provided at the position of one end portion 22a1 of second bus bar electrode 22 in the y direction. Therefore, finger electrode 24a1, finger electrode 25a1, and finger electrode 26a1 are arranged such that they are linearly aligned in the x direction perpendicular to the y direction.

Similarly, in finger electrode 25a2 positioned at the other end of second divided electrode 25 in the y direction and finger electrode 26a2 positioned at the other end of third divided electrode portion 26 in the y direction are also provided at the position of other end portion 22a2 of second bus bar electrode 22 in the y direction. Therefore, finger electrode 24a2, finger electrode 25a2, and finger electrode 26a2 are arranged such that they are linearly aligned in the x direction perpendicular to the y direction.

Since this embodiment is configured as described above, distance 1x2 between one end portion 1a1 of solar cell 1 and finger electrode 25a1 and distance 1x3 between one end portion 1a1 of solar cell 1 and finger electrode 26a1 can be made even smaller than in the fifth embodiment illustrated in FIG. 8. Therefore, a carrier generated in vicinity of one end portion 1a1 of solar cell 1 can be collected more efficiently.

Similarly, since finger electrodes 25a2 and 26a2 positioned at the other end in the y direction can also be brought close to other end portion 1a2 of solar cell 1, a carrier generated in vicinity of other end portion 1a2 of solar cell 1 can be collected more efficiently.

In each of the embodiments as described above, the description is given mainly on second bus bar electrode 22. However, the description of second bus bar electrode 21 is also to the same as that of second bus bar electrode 22. In addition, in each embodiment described above, although second finger electrode group 23 is divided into three divided electrode groups 24, 25, and 26, the invention is not limited to this. More specifically, second finger electrode group 23 has only to be divided into at least two divided electrode groups or may be divided into four or more divided electrode portions.

In each embodiment described above, although the description is given with the solar cell having the bus bar electrode as an example, the invention is not limited to this. More specifically, a solar cell may be a so-called bus bar-less solar cell that has no bus bar electrode provided. In this case, wiring is electrically connected with a finger electrode.

In general, a finger electrode is formed of an expensive conductive material such as silver. Thus, the formation of finger electrodes on both of a light-receiving surface side and a back surface side of a solar cell increases manufacturing cost of the solar cell. If the number of finger electrodes formed on a solar cell is reduced to cut down the manufacturing cost of the solar cell, power collection performance deteriorates, resulting in output reduction of the solar cell.

The embodiments of the solar cells described above are capable of reducing the amount of a conductive material used for a finger electrode while suppressing output reduction.

The invention claimed is:

1. A solar cell, comprising:
a first principal surface, and a second principal surface positioned on a side opposite to the first principal surface;
a first finger electrode group including finger electrodes on the first principal surface; and
a second finger electrode group including finger electrodes on the second principal surface, wherein
each of the finger electrodes of the first finger electrode group extends from one end portion of the first principal surface to the other end portion of the first principal surface in a first direction,
the second finger electrode group is divided into divided electrode portions, each of the finger electrodes of each divided electrode portion extending in the first direction, a number of finger electrodes of each divided electrode portion decreasing as a distance of each divided electrode portion from a central portion in the first direction of the second finger electrode group increases towards an outside,
a coupling portion is arranged between each adjacent ones of the divided electrode portions and electrically connects at least two finger electrodes of the divided electrode portion on an inside with at least one finger electrode of the divided electrode portion on an outside,
a number of finger electrodes of a divided electrode portion closest to the central portion of the second finger electrode group is larger than a number of the finger electrodes of the first finger electrode group, and
in an area where the divided electrode portion closest to the central portion of the second finger electrode group is provided, each of the finger electrodes of the first finger electrode group overlaps a corresponding one of the finger electrodes of the divided electrode portion closest to the central portion of the second finger electrode group, when viewed in a second direction substantially perpendicular to the first principal surface.

2. The solar cell according to claim 1, wherein each of finger electrodes of each divided electrode portion other than the divided electrode portion closest to the central portion of the second finger electrode group, is arranged in an area not overlapping the finger electrodes of the first finger electrode group, when viewed in the second direction.

3. The solar cell according to claim 1, wherein each finger electrode of the divided electrode portions is formed into a tapered shape with a width widening as the finger electrode of the divided electrode portions approaches the central portion of the second finger electrode group.

4. The solar cell according to claim 1, wherein the first principal surface side is a light-receiving side and the second principal surface side is a back surface side.

5. The solar cell according to claim 1, further comprising:
a first bus bar electrode on the first principal surface, the first bus bar electrode extending in a direction crossing the finger electrodes of the first finger electrode group; and
a second bus bar electrode on the second principal surface, the second bus bar electrode extending in a direction crossing the finger electrodes of the second finger electrode group and being arranged at the central portion of the second finger electrode group.

6. The solar cell according to claim 5, wherein a width of the coupling portion is narrower than a width of the second bus bar electrode.

7. The solar cell according to claim 5, wherein the second bus bar electrode is formed in a zigzag or a wavy line to extend in a direction crossing the finger electrodes of the second finger electrode group.

8. The solar cell according to claim 1, wherein the coupling portion is formed in a zigzag or a wavy line.

9. The solar cell according to claim 7, wherein
the coupling portion is formed in a zigzag or a wavy line, and
spacing of the zigzag or the wavy line of the coupling portion is shorter than spacing of the zigzag or the wavy line of the second bus bar electrode.

10. A solar cell module comprising solar cells according to claim 1, each adjacent ones of the solar cells being electrically connected by wiring, wherein the wiring is pressure-bonded by a resin adhesive to at least one of the finger electrodes of the first finger electrode group, at least one of the finger electrodes of the second finger electrode group, or a bus bar electrode.

11. A solar cell comprising;
a first principal surface, and a second principal surface positioned on a side opposite to the first principal surface;
a first finger electrode group including finger electrodes on the first principal surface;
a second finger electrode group including finger electrodes on the second principal surface;
a first bus bar electrode on the first principal surface, the first bus bar electrode extending in a direction crossing the finger electrodes of the first finger electrode group; and
a second bus bar electrode on the second principal surface, the second bus bar electrode extending in a direction crossing the finger electrodes of the second finger electrode group, wherein
each of the finger electrodes of the first finger electrode group extends from one end portion of the first principal surface to the other end portion of the first principal surface in a first direction,
the second finger electrode group is divided into divided electrode portions, each of the finger electrodes of each divided electrode portion extending in the first direction, a number of finger electrodes of each divided electrode portion increasing as a distance of each divided electrode portion from the second bus bar electrode decreases,
a coupling portion is arranged between each adjacent ones of the divided electrode portions and electrically connects at least two finger electrodes of the divided electrode portion on an inside with at least one finger electrode of the divided electrode portion on an outside,
a number of finger electrodes of a divided electrode portion closest to the second bus bar electrode is larger than a number of the finger electrodes of the first finger electrode group, and
in an area where the divided electrode portion closest to the second bus bar electrode is provided, each of the finger electrodes of the first finger electrode group overlaps a corresponding one of the finger electrodes of the divided electrode portion closest to the second bus bar electrode, when viewed in a second direction substantially perpendicular to the first principal surface.

12. A solar cell module comprising:

solar cells; and a wiring that electrically connects a first solar cell and a second solar cell of the solar cells, wherein the first solar cell comprises:

a first finger electrode group including finger electrodes on a first principal surface of the first solar cell; and a second finger electrode group including finger electrodes on a second principal surface of the first solar cell, the second principal surface being positioned on a side opposite to the first principal surface, wherein each of the finger electrodes of the first finger electrode group extends from one end portion of the first principal surface to the other end portion of the first principal surface in a first direction, the second finger electrode group is divided into divided electrode portions, each of the finger electrodes of each divided electrode portion extending in the first direction, a number of finger electrodes of each divided electrode portion decreasing as a distance of each divided electrode portion from the wiring increases, a coupling portion is arranged between each adjacent ones of the divided electrode portions and electrically connects at least two finger electrodes adjacent to the wiring with at least one finger electrode farther than the at least two finger electrodes from the wiring, a number of finger electrodes of a divided electrode portion closest to the wiring of the second finger electrode group is larger than a number of the finger electrodes of the first finger electrode group, and in an area where the divided electrode portion closest to the wiring of the second finger electrode group is provided, each of the finger electrodes of the first finger electrode group overlaps a corresponding one of the finger electrodes of the divided electrode portion closest to the wiring of the second finger electrode group, when viewed in a second direction substantially perpendicular to the first principal surface.

13. The solar cell module according to claim 12, wherein the first principal surface is a light-receiving surface.

* * * * *